(12) United States Patent
Pukhovski

(10) Patent No.: US 10,312,871 B2
(45) Date of Patent: *Jun. 4, 2019

(54) POWER AMPLIFIER CONFIGURATIONS WITH POWER DENSITY MATCHING

(71) Applicant: SKYWORKS SOLUTIONS, INC., Woburn, MA (US)

(72) Inventor: Anatoli Pukhovski, Ottawa (CA)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/792,692

(22) Filed: Oct. 24, 2017

(65) Prior Publication Data

US 2018/0159487 A1 Jun. 7, 2018

Related U.S. Application Data

(63) Continuation of application No. 14/872,638, filed on Oct. 1, 2015, now Pat. No. 9,800,216.

(60) Provisional application No. 62/066,487, filed on Oct. 21, 2014.

(51) Int. Cl.
| | | |
|---|---|---|
| H03F 3/04 | (2006.01) | |
| H03F 3/21 | (2006.01) | |
| H03F 3/19 | (2006.01) | |
| H03F 1/02 | (2006.01) | |
| H03F 3/45 | (2006.01) | |

(52) U.S. Cl.
CPC ............ *H03F 3/211* (2013.01); *H03F 1/0261* (2013.01); *H03F 3/19* (2013.01); *H03F 3/45475* (2013.01); *H03F 2200/18* (2013.01); *H03F 2200/451* (2013.01); *H03F 2203/21145* (2013.01); *H03F 2203/45154* (2013.01)

(58) Field of Classification Search
CPC ............. H03F 3/211; H03F 3/19; H03F 1/026
USPC .................................................. 330/136, 296
See application file for complete search history.

(56) References Cited

U.S. PATENT DOCUMENTS 9,800,216 B2 * 10/2017 Pukhovski ................ H03F 3/19

* cited by examiner

*Primary Examiner* — Khanh V Nguyen
*Assistant Examiner* — Khiem D Nguyen
(74) *Attorney, Agent, or Firm* — Chang & Hale LLP

(57) ABSTRACT

Circuits and methods related to power amplifiers. In some implementations, a bias circuit includes a reference device connectable to receive a first electrical supply level, the reference device arranged to produce an electrical bias condition using the first electrical supply level, and the reference device connectable to provide the electrical bias condition to an amplifier device connectable to a second electrical supply level. The bias circuit also includes a differential amplifier connectable to receive the first electrical supply level, the differential amplifier having a first input connectable to a first node of the reference device and a second input connectable to receive a reference electrical level, the differential amplifier arranged to maintain a first electrical level on the first node of the reference device as a function of the reference electrical level.

20 Claims, 5 Drawing Sheets

POWER AMPLIFIER CONFIGURATIONS WITH POWER DENSITY MATCHING

CROSS-REFERENCE TO RELATED APPLICATIONS

This application is a continuation of U.S. application Ser. No. 14/872,638 filed Oct. 1, 2015, entitled "BIAS CIRCUITRY FOR POWER AMPLIFIERS," which claims priority to U.S. Provisional Application No. 62/066,487 filed Oct. 21, 2014, entitled "BIAS CIRCUITRY FOR POWER AMPLIFIERS," each of which is expressly incorporated by reference herein in its entirety for all purposes.

BACKGROUND

Field

The present disclosure relates to power amplifiers in radio-frequency applications.

Description of the Related Art

Power amplifiers (PA) are widely used in networks in order to set the transmission power level of an information-bearing signal. For example, PAs are used to set the pulse emission energy of lasers in optical networks. PAs are also included in various wireless network devices—such as base stations and mobile devices—in order to set the transmission power level of a radio-frequency (RF) signal. PAs are also used in local area networks in order to enable wired and wireless connectivity of various devices.

Managing PA operation is important in a mobile device that uses a battery, because the power consumption of the PA often has a substantial impact on battery life. However, satisfying power consumption goals can be detrimental to other goals, such as linearity, which affects signal integrity and error control in data packets.

For example, bias circuitry is often provided to support the gain function of a PA, in addition to establishing the quiescent on-state conditions of PA transistors. Preferably, bias conditions support the PA in providing relatively constant gain, as a function of time, across a duration used to transmit a data packet. According to a first approach, bias circuitry is configured to operate using a lower voltage supply than the PA transistor in order to reduce power consumption.

A second approach includes switching the PA and the bias circuitry from an off-state to an on-state on demand (and then back to the off-state), so that the PA and bias circuitry do not dissipate power when data is not being transmitted. However, PA linearity is adversely affected by combining the first and second approaches. Nonlinear changes in the respective temperatures of the bias circuitry and the PA stem from the different voltage supply levels provided to each, and a switch from an off-state to an on-state. In turn, the power density in the PA does not track the power density in the bias circuitry, which causes a non-linear variation in gain that can be measured as a degradation in error vector magnitude (EVM).

SUMMARY

In accordance with a number of implementations, the present disclosure relates to a bias circuit that includes a reference device connectable to receive a first electrical supply level, the reference device arranged to produce an electrical bias condition using the first electrical supply level, and the reference device connectable to provide the electrical bias condition to an amplifier device connectable to a second electrical supply level. The bias circuit also includes a differential amplifier connectable to receive the first electrical supply level, the differential amplifier having a first input connectable to a first node of the reference device and a second input connectable to receive a reference electrical level, the differential amplifier arranged to maintain a first electrical level on the first node of the reference device as a function of the reference electrical level.

In some implementations, at least one of the reference device and the amplifier device includes one of a BJT, a MOSFET, a HBT, a MESFET, and a GaAsFET.

In some implementations, the first electrical supply level is a first voltage level that is less than a second voltage level corresponding to the second electrical supply level.

In some implementations, the bias circuit further includes a power density matching circuit connectable between the differential amplifier and the amplifier device, the power density matching circuit provided to substantially set a first power density associated with the reference device and a second power density associated with the amplifier device relative to one another, the first power density being a function of the first electrical supply level and the second power density being a function of the second electrical supply level.

In some implementations, the first power density is associated with a first transistor included in the reference device, and the second power density is associated with a second transistor included in the amplifier device.

In some implementations, the power density matching circuit includes a current translator circuit. In some implementations, the current translator circuit includes a combination of transistors that are each sized relative to one another in order to set a current density in the amplifier relative to a current density in the reference device. In some implementations, the current translator circuit includes portions of at least two current mirror arrangements of transistors.

In some implementations, the present disclosure relates to a module that includes a packaging substrate configured to receive a plurality of components. The module also includes a reference device connectable to receive a first electrical supply level, the reference device arranged to produce an electrical bias condition using the first electrical supply level, and the reference device connectable to provide the electrical bias condition to an amplifier device connectable to a second electrical supply level, and at least a portion of the reference device is included on the packaging substrate. The module further includes a differential amplifier connectable to receive the first electrical supply level, the differential amplifier having a first input connectable to a first node of the reference device and a second input connectable to receive a reference electrical level, the differential amplifier arranged to maintain a first electrical level on the first node of the reference device as a function of the reference electrical level.

In some implementations, the module is a power amplifier (PA) module.

In some implementations, the module further includes a power density matching circuit connectable between the reference device and the amplifier device, the power density matching circuit provided to substantially set a first power density associated with the reference device and a second power density associated with the amplifier device relative to one another, the first power density being a function of the first electrical supply level and the second power density being a function of the second electrical supply level, and at least a portion of the power density matching circuit is included on the packaging substrate.

In some implementations, at least a portion of the power density matching circuit is included on a first die.

In some implementations, the first power density is associated with a first transistor included in the reference device, and the second power density is associated with a second transistor included in the amplifier device.

In some implementations, the power density matching circuit includes a current translator circuit. In some implementations, the current translator circuit includes a combination of transistors that are each sized relative to one another in order to set a current density in the amplifier relative to a current density in the reference device. In some implementations, the current translator circuit includes portions of at least two current mirror arrangements of transistors.

According to some teachings, the present disclosure relates to a radio-frequency (RF) device that includes a transceiver configured to process RF signals. The RF device also includes an antenna in communication with the transceiver configured to facilitate transmission of an amplified RF signal and a power amplifier connected to the transceiver and configured to generate the amplified RF signal. The RF device further includes a bias module. The bias module includes a reference device connectable to receive a first electrical supply level, the reference device arranged to produce an electrical bias condition using the first electrical supply level, and the reference device connectable to provide the electrical bias condition to power amplifier connectable to a second electrical supply level. The bias module also includes a differential amplifier connectable to receive the first electrical supply level, the differential amplifier having a first input connectable to a first node of the reference device and a second input connectable to receive a reference electrical level, the differential amplifier arranged to maintain a first electrical level on the first node of the reference device as a function of the reference electrical level.

In some implementations, the RF device includes a wireless device. In some implementations, the wireless device includes at least one of a base station, a repeater, a cellular phone, a smartphone, a computer, a laptop, a tablet computer, and peripheral device.

In some implementations, the bias module further includes including a power density matching circuit connectable between the reference device and the power amplifier, the power density matching circuit provided to substantially set a first power density associated with the reference device and a second power density associated with the power amplifier relative to one another, the first power density being a function of the first electrical supply level and the second power density being a function of the second electrical supply level.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
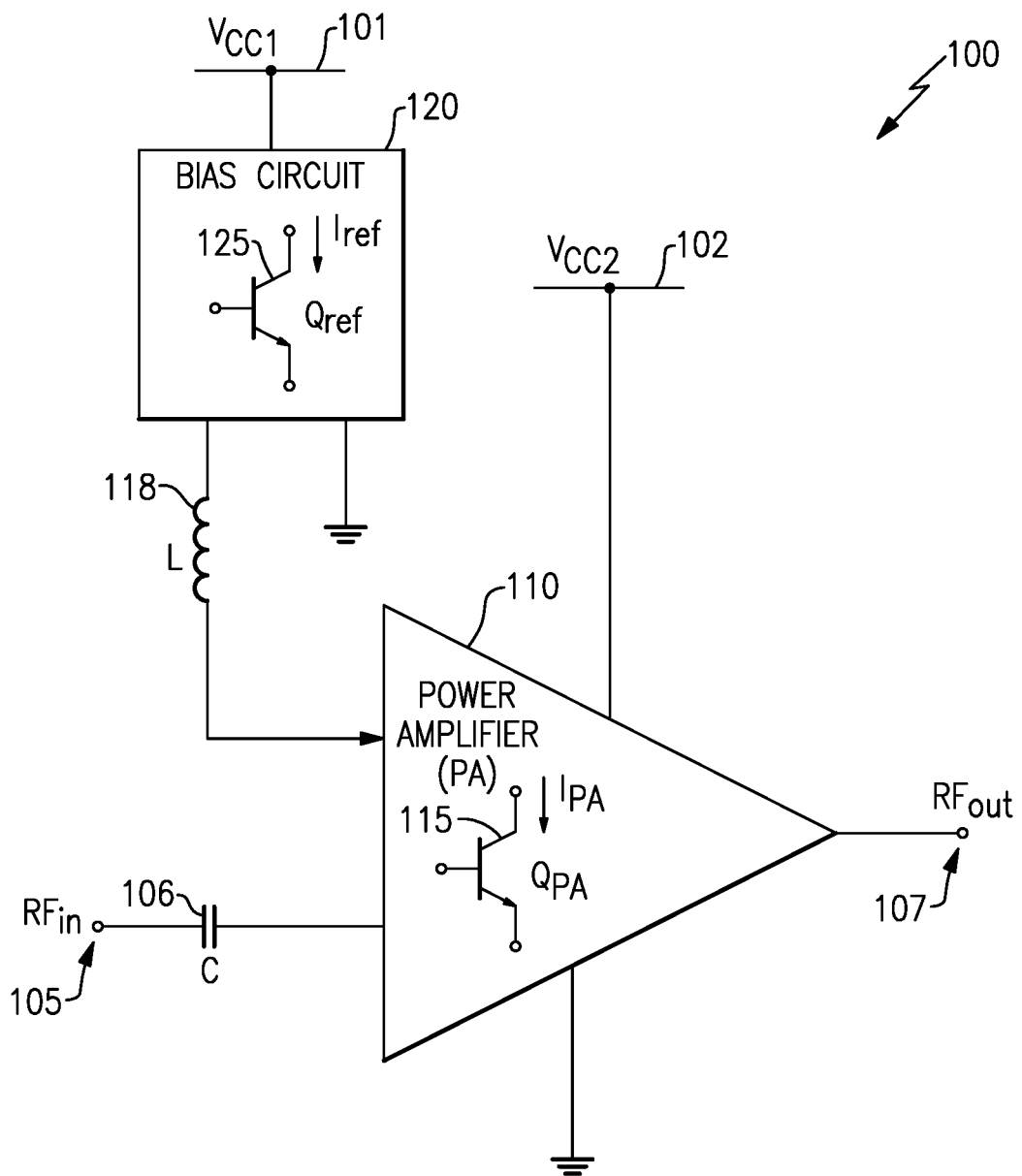
FIG. 1 is a simplified block diagram of a power amplifier arrangement in accordance with some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION OF SOME IMPLEMENTATIONS

The headings provided herein, if any, are for convenience only and do not necessarily affect the scope or meaning of the claimed invention.

Power amplifiers (PA) are widely used in networks in order to set the transmission power level of a data-bearing signal. For example, PAs are used to set the pulse energy of lasers in optical networks. PAs are also included in various wireless network devices—such as base stations and mobile devices—in order to set the power level of a radio-frequency (RF) signal. PAs are also used in local area networks in order to enable wired and wireless connectivity.

Management of PA operation is generally important in a mobile device that uses a battery, because the power consumption of the PA has a substantial impact on battery life. However, power consumption goals often compete with various other goals of PA operation, such as linearity, which affects signal integrity and data error control.

For example, bias circuitry is often provided to support the gain function of a PA, in addition to setting on-state conditions of PA transistors. In particular, it is desirable for bias circuitry to support the PA in providing relatively constant gain across a duration used to transmit a data packet. According to a first approach for conserving power, bias circuitry is specified to operate using a lower voltage supply than the PA. However, as the supply voltage level provided to the bias circuitry gets smaller it is difficult to maintain a preferred reference current level ($I_{ref}$), and thus, a preferred power density within the bias circuitry. In turn, the power density in the PA is adversely affected, which causes non-linear variations in gain.

FIG. 1, for example, is a schematic diagram of a power amplifier (PA) operating configuration 100 according to some implementations. While pertinent features are illustrated, those skilled in the art will appreciate from the present disclosure that various other features have not been illustrated for the sake of brevity and so as not to obscure more pertinent aspects of the example implementations disclosed herein. To that end, as a non-limiting example, the PA operating configuration 100 includes a PA 110 and a bias circuit 120.

The bias circuit 120 is coupled to a first voltage supply line ($V_{CC1}$) 101 in order to receive the first voltage level $V_{CC1}$. The bias circuit 120 includes a reference transistor ($Q_{ref}$) 125. While the reference transistor ($Q_{ref}$) 125 shown in FIG. 1 is a BJT (bipolar junction transistor), those of ordinary skill in the art will appreciate from the present disclosure that other types of transistors (e.g., a metal-oxide-semiconductor field-effect transistor (MOSFET), heterojunction bipolar transistor (HBT), metal-semiconductor field-effect transistor (MESFET), gallium arsenide field-effect transistor (GaAsFET), or the like) are available for other implementations. The reference transistor ($Q_{ref}$) 125, along with the remainder of the bias circuit 120, is used to provide a reference current ($I_{ref}$) to the PA 110, which serves as an electrical bias condition that is utilized by one or more transistors included in the PA 110. To that end, the bias circuit 120 is coupled to the PA 110 through inductor (L) 118, in order to provide the reference current ($I_{ref}$).

The PA 110 is also coupled to receive a radio-frequency (RF) input signal ($RF_{in}$) from node 105 through coupling capacitor 106 (C), and provide an amplified RF output signal ($RF_{out}$) to an antenna through node 107. The PA 110 draws operating current from a second voltage supply line ($V_{CC2}$) 102 in order to receive the second voltage level $V_{CC2}$. In some implementations, the second voltage level $V_{CC2}$ is greater than the first voltage level $V_{CC1}$. For example, in various implementations, the second voltage level $V_{CC2}$ is approximately double the first voltage level $V_{CC1}$ (e.g., $V_{CC2}$=5.0 V, $V_{CC1}$=2.2 V). For the sake of convenience and brevity, FIG. 1 includes a single amplifying transistor ($Q_{PA}$) 115. However, those of ordinary skill in the art will appreciate from the present disclosure that, in various implementations, a PA includes multiple amplifying transistors in various arrangements. Also, while the amplifying transistor ($Q_{PA}$) 115 shown in FIG. 1 is a BJT, those of ordinary skill in the art will appreciate from the present disclosure that other types of transistors (e.g., MOSFET, HBT, MESFETs, GaAsFETs, etc.) are available for other implementations.

As noted above, in operation, for some implementations, as the first voltage level $V_{CC1}$ provided to the bias circuitry gets smaller it is difficult to maintain a preferred reference current level ($I_{ref}$) (and power density) within the reference transistor ($Q_{ref}$) 125. In particular, for III-V semiconductor-based transistors, a voltage level of approximately $2V_{BE}$ is applied to the collector of the reference transistor ($Q_{ref}$) 125 in order to maintain the reference transistor ($Q_{ref}$) 125 in a suitable on-state. As the first voltage level $V_{CC1}$ falls below $2V_{BE}$ it becomes difficult to maintain any collector voltage because the reference transistor ($Q_{ref}$) 125 is likely to drift into an off-state.

More specifically, nonlinear changes in the respective temperatures of a reference transistor in the bias circuit 120 and an amplifying transistor 115 in the PA 110 stem from the different voltage supply levels provided to each. In turn, the power density in the amplifying transistor 115 does not track the power density in the reference transistor 125.

Typically an on-state is much shorter than the adjacent off-states. As such, transistors in both the bias circuit 120 and the PA 110 typically have to heat up to a stable temperature, which can take as long as 200 µsec. A typical data packet, and thus the typical on-state, can be shorter than 200 µsec, while a typical off-state is often more than 10 msec. As such, in many instances, the transistors in both the bias circuit 120 and the PA 110 do not make it to a stable temperature. In view of the power savings gained by switching between on-states and off-states, in some cases it is sufficient to accept variations in gain when the power density in the reference transistor in the bias circuit 120 at least tracks the power density in the amplifying transistor 115 of the PA 110. However, power density tracking is not possible when the bias circuit 120 is configured to operate using a lower supply voltage than the amplifying transistor 115 in order to reduce power consumption, according to the first approach.

The various implementations described herein include systems, methods and/or circuit-based devices provided to maintain a first electrical level on the first node of a reference device as a function of a reference electrical level. Numerous details are described herein in order to provide a thorough understanding of the example implementations illustrated in the accompanying drawings. However, the invention may be practiced without many of the specific details. Well-known methods, components, and circuits have not been described in exhaustive detail so as not to unnecessarily obscure more pertinent aspects of the implementations described herein.

Figure 2:
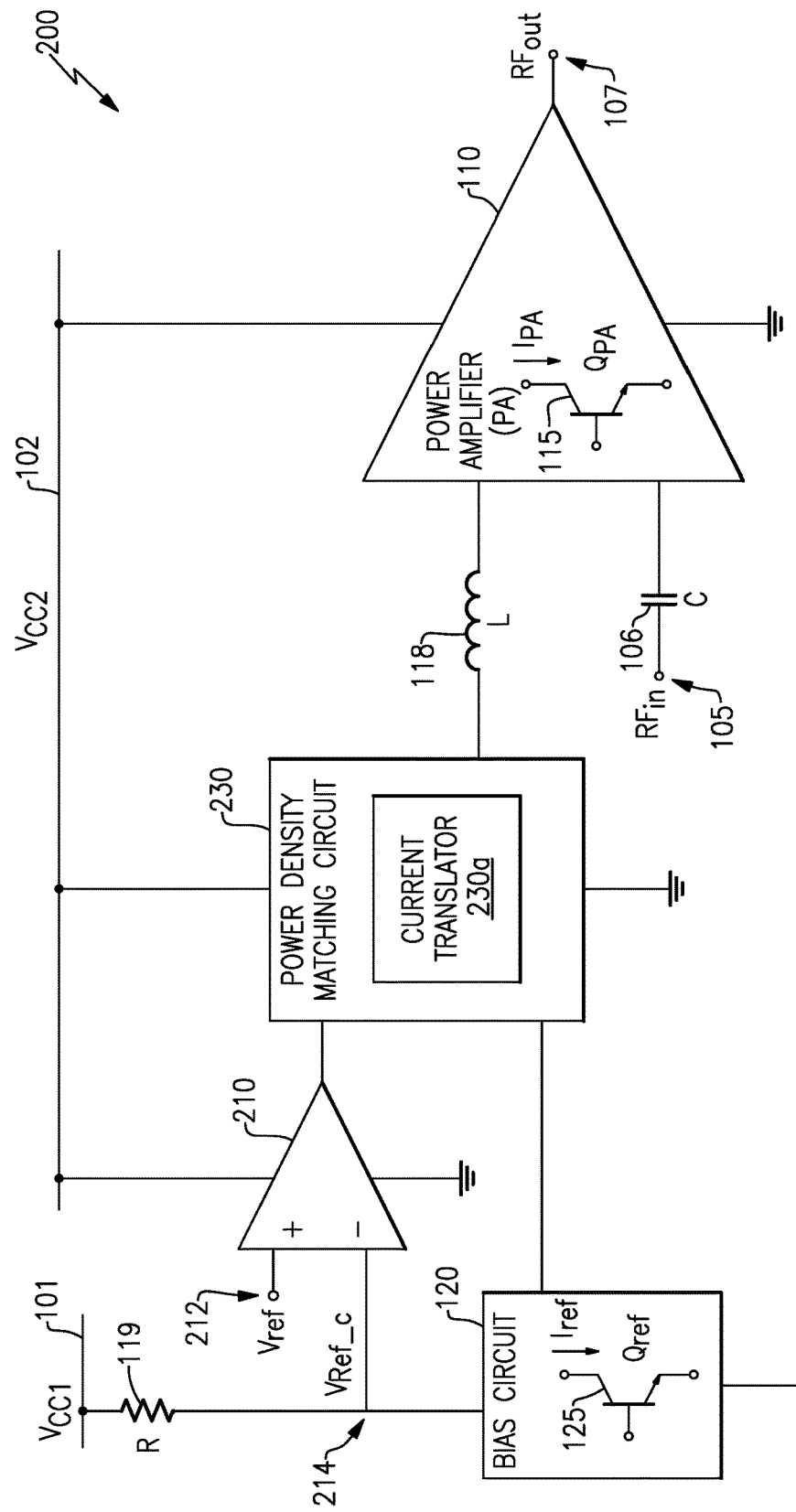
FIG. 2 is a schematic diagram of a power amplifier arrangement with a power density matching circuit in accordance with some implementations.

FIG. 2 is a schematic diagram of a power amplifier (PA) operating configuration 200 in accordance with some implementations. While certain specific features are illustrated, those skilled in the art will appreciate from the present disclosure that various other features have not been illustrated for the sake of brevity and so as not to obscure more pertinent aspects of the example implementations disclosed herein. Moreover, the PA operating configuration 200 in FIG. 2 is similar to and adapted from the PA operating configuration 100 in FIG. 1. Elements common to each include common reference numbers, and only the differences between FIGS. 1 and 2 are described herein for the sake of brevity.

To that end, the PA operating configuration 200 includes a power density matching circuit 230 coupled between the bias circuit 120 and the inductor (L) 118. The power density matching circuit 230 is also coupled to the second voltage supply line ($V_{CC2}$) 102 in order to receive the second voltage level $V_{CC2}$. In operation, the power density matching circuit matches a first power density in the reference transistor ($Q_{ref}$) 125 to a second power density in the amplifying transistor ($Q_{PA}$) 115.

The PA operating configuration 200 also includes a differential amplifier 210 (e.g., an op-amp) coupled between the collector of the reference transistor ($Q_{ref}$) 125 and the power density matching circuit 230. The differential amplifier 210 is also coupled to the second voltage supply line ($V_{CC2}$) 102 in order to receive the second voltage level $V_{CC2}$.

A first input of the differential amplifier 210 is coupled to node 214, which couples the collector of the reference transistor ($Q_{ref}$) 125 and the resistor (R) 119. The resistor (R) 119 is coupled to the first voltage supply line ($V_{CC1}$) 101 in order to receive the first voltage level $V_{CC1}$. A second input of the differential amplifier 210 is coupled to node 212, which is provided to receive a reference voltage ($V_{ref}$). In operation, the differential amplifier 210 effectively operates as a feedback circuit that pulls the voltage ($V_{Ref\_C}$) on node 214 (and thus the collector of the reference transistor ($Q_{ref}$) 125) to at least $2V_{BE}$. Absent the differential amplifier 210, the resistor (R) 119 connecting first voltage level $V_{CC1}$ to the collector of the reference transistor ($Q_{ref}$) 125 would permit a voltage drop that would vary the reference current ($I_{ref}$), and thus cause the reference transistor ($Q_{ref}$) 125 to operate at a less preferred power density.

In some implementations, because the differential amplifier 210 is powered by the second voltage level $V_{CC2}$, the first voltage level $V_{CC1}$ can be less than $2V_{BE}$ and the differential amplifier 210 is still operable to provide $V_{out} > 2 V_{BE}$. Moreover, the differential amplifier 210 enables the reference current ($I_{ref}$) to be a function of the drop across the resistor (R) 119

$$\left(\text{i.e., } I_{ref} = \frac{V_{CC1} - V_{Ref\_C}}{R}\right).$$

Figure 3:
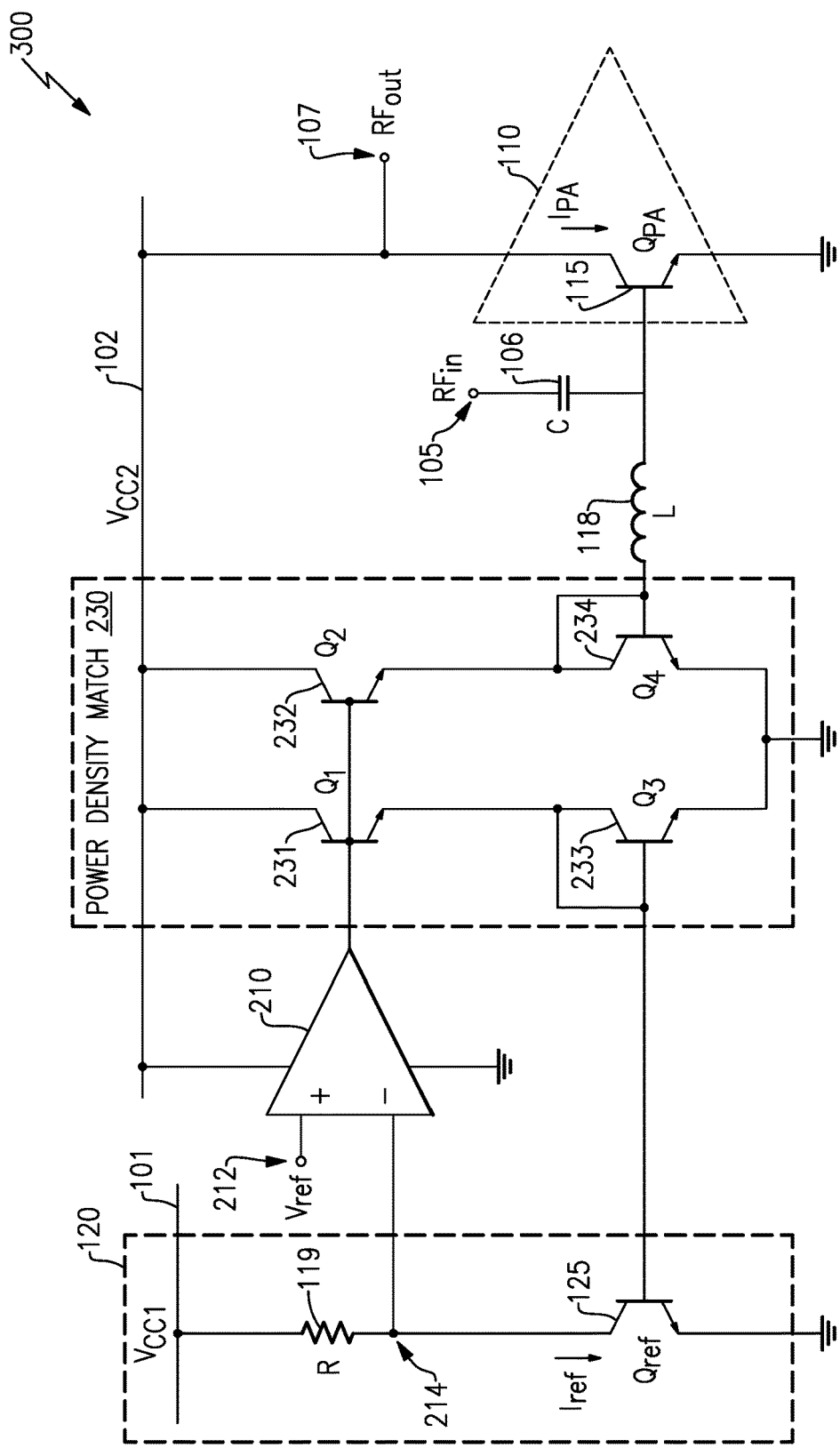
FIG. 3 is a schematic diagram of a power amplifier arrangement with a power density matching circuit in accordance with some implementations.

With reference to FIG. 3, since the differential amplifier 210 in the loop corrects the current in the first and third transistors 231, 233 ($Q_1$, $Q_3$), and subsequently in the reference transistor ($Q_{ref}$) 125 as well, the voltage at node 214 approaches $V_{ref}$. A benefit of this configuration is that the value of the resistor (R) 119 can be made sufficiently large so that any temperature effects on the reference current $I_{ref}$ are substantially reduced. In turn, the first voltage level $V_{CC1}$ can be less than $2V_{BE}$, which in some implementations, enables circuits to remain operational when the first voltage level $V_{CC1}$ is in the range of 3.0 V (or lower). In some implementations, the voltage at node 214 can be as low as $V_{BE}$. In some implementations, the transistors in the power density matching circuit 230 are also scaled to provide power density matching between the reference transistor ($Q_{ref}$) 125 and the amplifying transistor ($Q_{PA}$) 115.

FIG. 3 is a schematic diagram of a power amplifier (PA) operating configuration 300 in accordance with some implementations. While certain specific features are illustrated, those skilled in the art will appreciate from the present disclosure that various other features have not been illustrated for the sake of brevity and so as not to obscure more pertinent aspects of the example implementations disclosed herein. Moreover, the PA operating configuration 300 in FIG. 3 is similar to and adapted from the PA operating configuration 200 in FIG. 2. Elements common to each include common reference numbers, and only the differences between FIGS. 2 and 3 are described herein for the sake of brevity.

To that end, the PA operating configuration 200 includes a power density matching circuit 230 coupled between the bias circuit 120 and the inductor (L) 118. In turn, the inductor (L) 118 is coupled to the base of the amplifying transistor ($Q_{PA}$) 115 of the PA 110. The coupling capacitor (C) 106 is also coupled between input node 105 and the base of the amplifying transistor ($Q_{PA}$) 115 in order to provide an AC input path to the PA 110. The collector of the amplifying transistor ($Q_{PA}$) 115 is coupled to the second voltage supply line ($V_{CC2}$) 102 in order to draw DC operating current. The collector of the amplifying transistor ($Q_{PA}$) 115 is also coupled to node 107 in order to provide the amplified radio-frequency (RF) output signal ($RF_{out}$).

Those of ordinary skill in art will appreciate that in some implementations, a choke or AC blocking inductor (not shown) can be provided between the collector of the amplifying transistor ($Q_{PA}$) 115 and the second voltage supply line ($V_{CC2}$) 102. Additionally and/or alternatively, those of ordinary skill in the art will also appreciate that a DC blocking, AC coupling capacitor can be provided in series with node 107 in order to provide a substantially AC output path from the collector the amplifying transistor ($Q_{PA}$) 115 through node 107. With reference to the bias circuit 120, the collector of the reference transistor ($Q_{ref}$) 125 is coupled to the first voltage supply line ($V_{CC1}$) 101, and the emitter is coupled to ground.

In some implementations, the power density matching circuit 230 includes a combination of transistors provided to match power density changes between the amplifying transistor ($Q_{PA}$) 115 and the reference transistor ($Q_{ref}$) 125. In some implementations, the power density matching circuit 230 includes four transistors 231, 232, 233, 244 ($Q_1$, $Q_2$, $Q_3$, $Q_4$) arranged as follows to form a temperature independent current translator. The first and third transistors 231, 233 ($Q_1$, $Q_3$) are coupled emitter-to-collector between the second voltage supply line ($V_{CC2}$) 102 and ground. The collector of the first transistor 231 ($Q_1$) is coupled to the second voltage supply line ($V_{CC2}$) 102. The base of the first transistor 231 ($Q_1$) is coupled to the output node of the differential amplifier 210. The base of the third transistor 233 ($Q_3$) is coupled to the collector of the third transistor 233 ($Q_3$), and the emitter of the third transistor 233 ($Q_3$) is coupled to ground. Similarly, the second and fourth transistors 232, 234 ($Q_2$, $Q_4$) are also coupled emitter-to-collector between the second voltage supply line ($V_{CC2}$) 102 and ground. The collector of the second transistor 231 ($Q_2$) is coupled to the second voltage supply line ($V_{CC2}$) 102. The base of the second transistor 231 ($Q_2$) is coupled to the output node of the differential amplifier 210. The base of the fourth transistor 234 ($Q_4$) is coupled to the collector of the fourth transistor 234 ($Q_3$), and the emitter of the fourth transistor 234 ($Q_4$) is coupled to ground.

In various implementations, temperature independent current translation, and thus power density matching, is provided by sizing the four transistors 231, 232, 233, 244 ($Q_1$, $Q_2$, $Q_3$, $Q_4$) in accordance with equation (1) as follows:

$$I_{PA} = I_{ref} \frac{E_{PA}}{E_{ref}} \sqrt{\frac{E_2 E_3}{E_1 E_4}} \tag{1}$$

With respect to equation (1), $E_1$, $E_2$, $E_3$, $E_4$ are the respective emitter areas of the four transistors 231, 232, 233, 244 ($Q_1$, $Q_2$, $Q_3$, $Q_4$). Similarly, $E_{ref}$, $E_{PA}$ are the respective emitter areas of the transistors 125, 115 ($Q_{ref}$, $Q_{PA}$). As such, the current density ($J_{PA/ref}$ $ref_i$) in the amplifying transistor ($Q_{PA}$) 115 relative to the reference transistor ($Q_{ref}$) 125 is provided by equation (2) as follows:

$$J_{PA|ref} = \sqrt{\frac{E_2 E_3}{E_1 E_4}} \tag{2}$$

As an example, for $J_{PA/ref}=2$, $E_4=4E_1=4E_2=4E_3$.

Figure 4A:
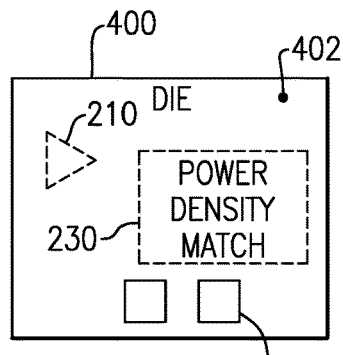
FIGS. 4A, 4B, and 4C are schematic diagrams of different integrated circuit implementations of the power density matching circuit of FIG. 2.
Figure 4B:
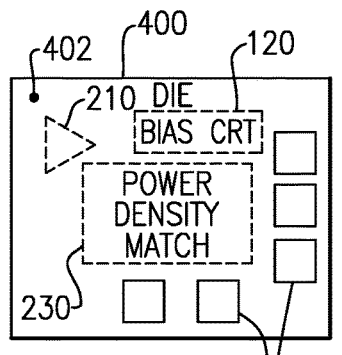
Figure 4C:
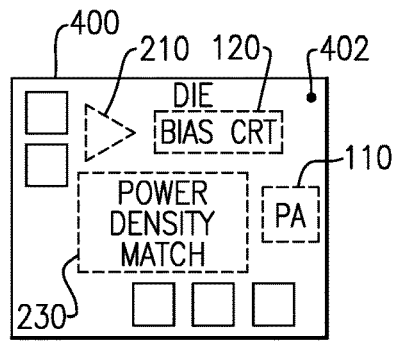

FIGS. 4A-4C are schematic diagrams of different integrated circuit implementations of the bias circuitry of FIGS. 2 and 3. While some example features are illustrated, those skilled in the art will appreciate from the present disclosure that various other features have not been illustrated for the sake of brevity and so as not to obscure more pertinent aspects of the example implementations disclosed herein. To that end, for example, FIG. 4A shows that, in some implementations, some or all portions of the differential amplifier 210 and/or some or all portions of the power density matching circuit 230 are included on a semiconductor die 400. By way of an example, the differential amplifier 210 and/or the power density matching circuit 230 can be formed on a substrate 402 of the die 400. A plurality of connection pads 404 can also be formed on the substrate 402 to facilitate functionalities associated with some or all portions of the differential amplifier 210 and/or some or all portions the power density matching circuit 230.

FIG. 4B shows that in some implementations, a semiconductor die 400 having a substrate 402 can include some or all portions of the bias circuit 120, some or all portions of the differential amplifier 210, and some or all portions of the power density matching circuit 230. A plurality of connection pads 404 can also be formed on the substrate 402 to facilitate functionalities associated with some or all portions of the differential amplifier 210, some or all portions of the bias circuit 120 and some or all portions of the power density matching circuit 230.

FIG. 4C shows that in some implementations, a semiconductor die 400 having a substrate 402 can include some or all portions of the power amplifier (PA) 110, some or all portions of the differential amplifier 210, some or all portions of the bias circuit 110 and some or all portions of the power density matching circuit 230. A plurality of connection pads 404 can also be formed on the substrate 402 to facilitate functionalities associated with some or all portions of the PA 110, the differential amplifier 210, the bias circuit 120, and the power density matching circuit 230.

Figure 5:
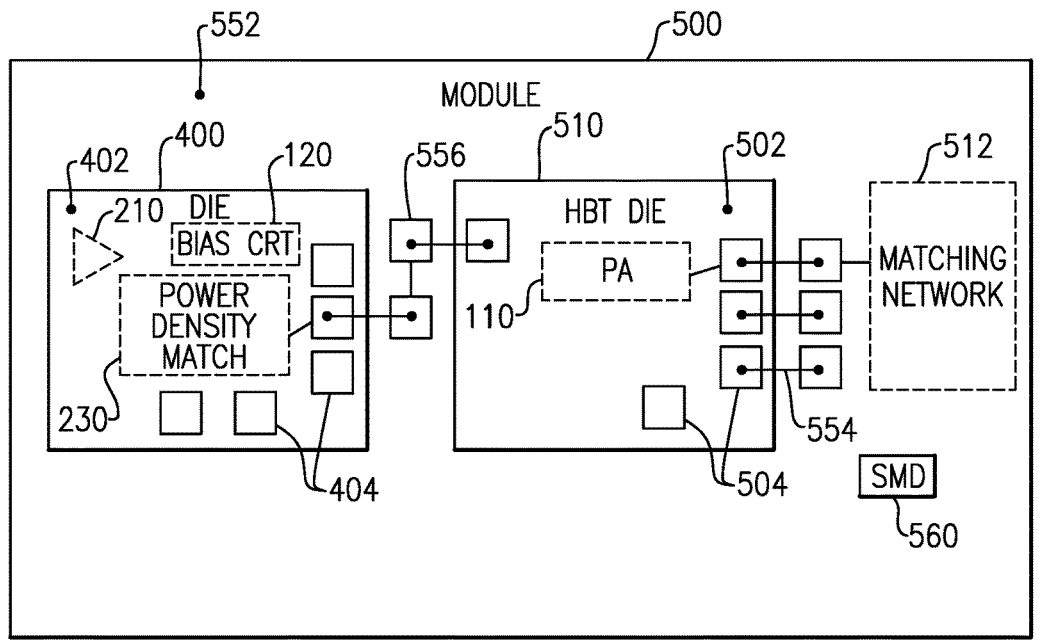
FIG. 5 is a schematic diagram of an implementation of a module including the power density matching circuit of FIG. 2.

In some implementations, one or more features described herein can be included in a module. FIG. 5 is a schematic diagram of an implementation of a module 500 including the bias circuitry of FIGS. 2 and 3. While some example features are illustrated, those skilled in the art will appreciate from the present disclosure that various other features have not been illustrated for the sake of brevity and so as not to obscure more pertinent aspects of the example implementations disclosed herein. The module 500 includes a packaging substrate 552, connection pads 556, a die 400 (e.g., a bipolar junction transistor (BJT) die), a die 510 (e.g., heterojunction bipolar transistor (HBT) die), a matching network 512, and one or more surface mount devices (SMDs) 560.

The BJT die 400 includes a substrate 402 including some or all portions of the bias circuit 120 and some or all portions of the power density matching circuit 230 of FIG. 2. A plurality of connection pads 404 is formed on the substrate 402 to facilitate functionalities associated with some or all portions of the bias circuit 120, some or all portions of the differential amplifier 210, and some or all portions of the power density matching circuit 230. Similarly, the HBT die 510 includes a substrate 502 including some or all portions of the PA 110. The HBT die 510 also includes a plurality of connection pads 1104 formed on the substrate 502 to facilitate functionalities associated with some or all portions of the PA 110.

The connection pads 556 on the packaging substrate 552 facilitate electrical connections to and from each of the BJT die 400 and the HBT die 500. For example, the connection pads 556 facilitate the use of wirebonds 554 for passing various signals and supply currents and/or voltages to each of the BJT die 400 and the HBT die 500.

In some implementations, the components mounted on the packaging substrate 552 or formed on or in the packaging substrate 552 can further include, for example, one or more surface mount devices (SMDs) (e.g., 560) and one or more matching networks (e.g., 516). In some implementations, the packaging substrate 552 can include a laminate substrate.

In some implementations, the module 500 can also include one or more packaging structures to, for example, provide protection and facilitate easier handling of the module 500. Such a packaging structure can include an overmold formed over the packaging substrate 552 and dimensioned to substantially encapsulate the various circuits and components thereon.

It will be understood that although the module 1150 is described in the context of wirebond-based electrical connections, one or more features of the present disclosure can also be implemented in other packaging configurations, including flip-chip configurations.

In some implementations, a device and/or a circuit having one or more features described herein can be included in a radio-frequency (RF) device such as a wireless device. Such a device and/or a circuit can be implemented directly in the wireless device, in a modular form as described herein, or in some combination thereof. In some implementations, such a wireless device can include, for example, a cellular phone, a smart-phone, a hand-held wireless device with or without phone functionality, a wireless tablet, a wireless router, a wireless access point, a wireless base station, etc. That is, those skilled in the art will also appreciate from the present disclosure that in various implementations the power amplifier open loop current clamp may be included in various devices, such as a computer, a laptop computer, a tablet device, a netbook, an internet kiosk, a personal digital assistant, an optical modem, a base station, a repeater, a wireless router, a mobile phone, a smartphone, a gaming device, a computer server, or any other computing device. In various implementations, such devices include one or more processors, one or more types of memory, a display, and/or other user interface components such as a keyboard, a touch screen display, a mouse, a track-pad, a digital camera and/or any number of supplemental devices to add functionality.

Figure 6:
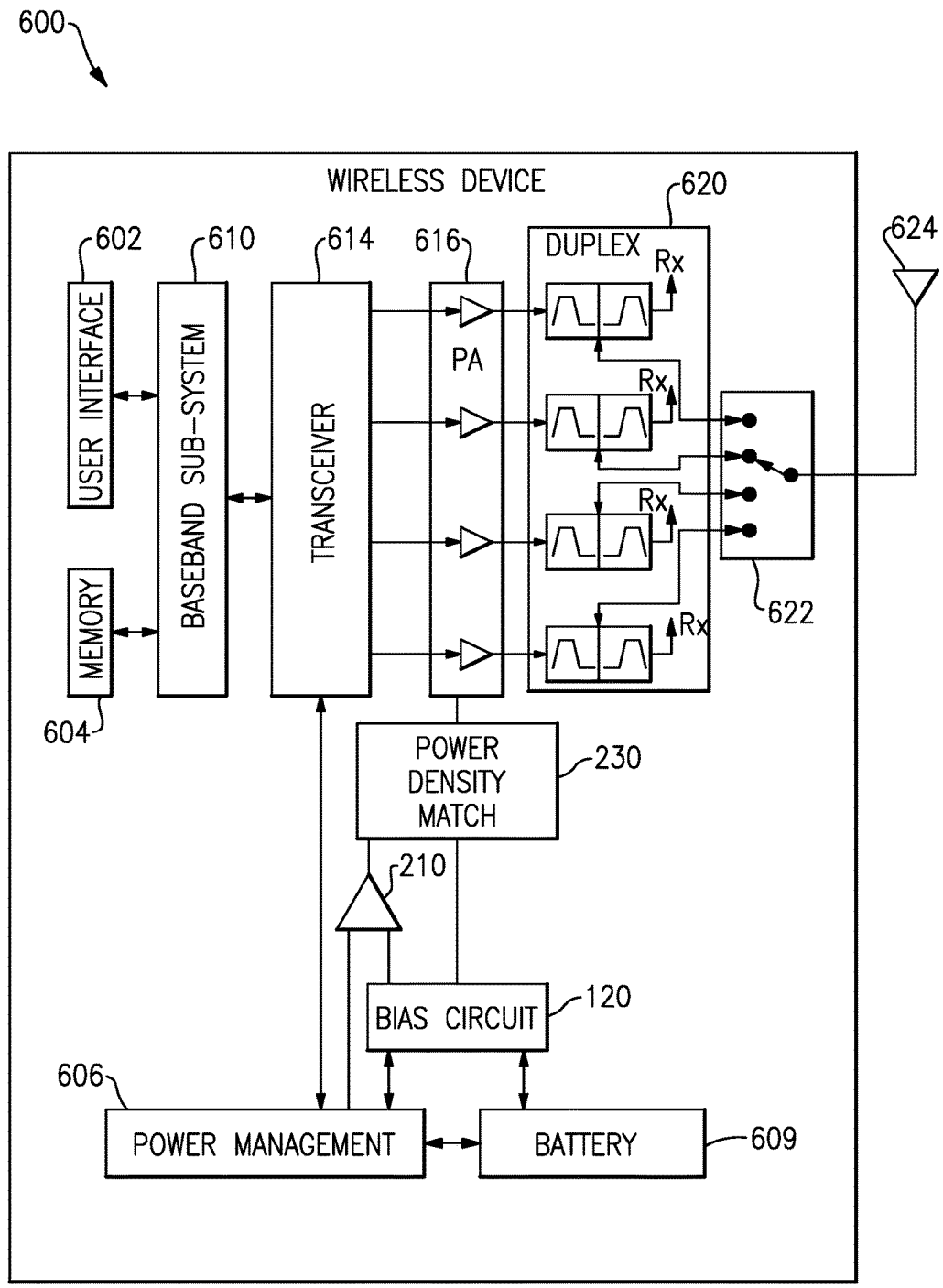
FIG. 6 is a schematic diagram of an implementation of a wireless device including the power density matching circuit of FIG. 2.

FIG. 6 is a schematic diagram of an implementation of a wireless device 600 including one or more features described herein, such as the differential amplifier 210 and the power density matching circuit 230. While some example features are illustrated, those skilled in the art will appreciate from the present disclosure that various other features have not been illustrated for the sake of brevity and so as not to obscure more pertinent aspects of the example implementations disclosed herein.

One or more power amplifiers (PAs) 616 as described herein are biased by respective bias circuit(s) (not shown) and compensated by respective compensation circuit(s) (not shown). In some implementations the PAs 616 are packaged into a module, including for example an HBT die. The PAs 616 can receive respective radio-frequency (RF) signals from a transceiver 614, that can be configured and operated in known manners to generate RF signals to be amplified and transmitted, and to process received signals. The transceiver 614 is shown to interact with a baseband sub-system 610 that is configured to provide conversion between data and/or voice signals suitable for a user and RF signals suitable for the transceiver 614. The transceiver 614 is also shown to be connected to a power management component 606 that is configured to manage power for the operation of the wireless device 600. To that end, the power management module is coupled to the bias circuit 120, the differential amplifier 210, and the power density matching circuit 230, which are coupled between the PAs 616 and the battery 609.

The baseband sub-system 610 is shown to be connected to a user interface 602 to facilitate various input and output of voice and/or data provided to and received from the user. The baseband sub-system 610 can also be connected to a memory 604 that is configured to store data and/or instructions to facilitate the operation of the wireless device, and/or to provide storage of information for the user.

In the example wireless device 600, outputs of the PAs 616 are matched and routed to an antenna 624 via respective duplexers 620 and a band-selection switch 622. The band-selection switch 622 can include, for example, a single-pole-multiple-throw (e.g., SP4T) switch to allow selection of an operating band (e.g., Band 2). In some implementations, each duplexer 620 can allow transmit and receive operations to be performed simultaneously using a common antenna (e.g., 624). In FIG. 6, received signals are shown to be routed to "Rx" paths (not shown) that can include, for example, one or more low-noise amplifiers (LNAs).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some implementations of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier configuration comprising:
a bias circuit configured to receive a first electrical supply level from a first voltage supply line, the bias circuit including a reference device and a differential amplifier, the differential amplifier coupled to the reference device and configured to receive a second electrical supply level from a second voltage supply line and to cause the reference device to operate at a targeted power density;
a power amplifier having an amplifying device and configured to receive at a first input an input signal and to provide at an output an amplified output signal;
an inductor coupled to a second input of the power amplifier; and
a power density matching circuit coupled between the bias circuit and the inductor and also coupled to an output of the differential amplifier, the power density matching circuit configured to receive the second electrical supply level that is greater than the first electrical supply level, the power density matching circuit configured to match a first power density in the reference device of the bias circuit to a second power density in the amplifying device.

2. The power amplifier configuration of claim 1 further comprising a resistor coupled to the bias circuit and to the differential amplifier to adjust the first electrical supply level.

3. The power amplifier configuration of claim 1 wherein the power density matching circuit includes a plurality of transistors provided to match power density changes between the amplifying device and the reference device.

4. The power amplifier configuration of claim 3 wherein the power density matching circuit includes four transistors arranged to form a temperature independent current translator.

5. The power amplifier configuration of claim 4 wherein a first and third transistor are coupled emitter-to-collector between the second voltage supply line and a reference potential node.

6. The power amplifier configuration of claim 5 wherein:
a collector of the first transistor is coupled to the second voltage supply line;
a base of the first transistor is coupled to an output node of the differential amplifier;
a base of the third transistor is coupled to a collector of the third transistor; and
an emitter of the third transistor is coupled to the reference potential node.

7. The power amplifier configuration of claim 5 wherein a second and fourth transistor are coupled emitter-to-collector between the second voltage supply line and the reference potential node.

8. The power amplifier configuration of claim 7 wherein:
a collector of the second transistor is coupled to the second voltage supply line;
a base of the second transistor is coupled to an output node of the differential amplifier;
a base of the fourth transistor is coupled to a collector of the fourth transistor; and
an emitter of the fourth transistor is coupled to the reference potential node.

9. The power amplifier configuration of claim 1 wherein the reference device includes a BJT, a MOSFET, a HBT, a MESFET, or a GaAsFET.

10. The power amplifier configuration of claim 1 wherein the power density matching circuit includes a current translator circuit.

11. The power amplifier configuration of claim 10 wherein the current translator circuit includes a combination of transistors that are each sized relative to one another to set a current density in the amplifying device relative to a current density in the reference device.

12. The power amplifier configuration of claim 6 wherein the current translator circuit includes portions of at least two current mirror arrangements of transistors.

13. A power amplifier module comprising:
a packaging substrate configured to receive a plurality of components;
a bias circuit implemented on the packaging substrate and configured to receive a first electrical supply level from a first voltage supply line, the bias circuit including a reference device and a differential amplifier, the differential amplifier coupled to the reference device and configured to receive a second electrical supply level from a second voltage supply line and to cause the reference device to operate at a targeted power density;
a power amplifier implemented on the packaging substrate and having an amplifying device and configured to receive at a first input an input signal and to provide at an output an amplified output signal;
an inductor implemented on the packaging substrate and coupled to a second input of the power amplifier; and
a power density matching circuit implemented on the packaging substrate and coupled between the bias circuit and the inductor and also coupled to an output of the differential amplifier, the power density matching circuit configured to receive the second electrical supply level that is greater than the first electrical supply level, the power density matching circuit configured to match a first power density in the reference device of the bias circuit to a second power density in the amplifying device.

14. The power amplifier module of claim 13 wherein at least a portion of the power density matching circuit is included on a first die.

15. The power amplifier module of claim 13 wherein the power density matching circuit includes a current translator circuit.

16. The power amplifier module of claim 15 wherein the current translator circuit includes a combination of transistors that are each sized relative to one another to set a current density in the amplifying device relative to a current density in the reference device.

17. The power amplifier module of claim 15 wherein the current translator circuit includes portions of at least two current mirror arrangements of transistors.

18. A radio frequency (RF) device comprising:
a transceiver configured to process RF signals;
an antenna in communication with the transceiver configured to facilitate transmission of an amplified RF signal;
a power amplifier module connected to the transceiver and configured to generate the amplified RF signal, the power amplifier module including a bias circuit configured to receive a first electrical supply level from a first voltage supply line, the bias circuit including a reference device and a differential amplifier, the differential amplifier coupled to the reference device and configured to receive a second electrical supply level from a second voltage supply line and to cause the reference device to operate at a targeted power density; a power amplifier having an amplifying device and configured to receive at a first input an input signal and to provide at an output an amplified output signal; an inductor coupled to a second input of the power amplifier; and a power density matching circuit coupled between the bias circuit and the inductor and also coupled to an output of the differential amplifier, the power density matching circuit configured to receive the second electrical supply level that is greater than the first electrical supply level, the power density matching circuit configured to match a first power density in the reference device of the bias circuit to a second power density in the amplifying device.

19. The RF device of claim 18 wherein the RF device includes a wireless device.

20. The RF device of claim 18 wherein the wireless device includes at least one of a base station, a repeater, a cellular phone, a smartphone, a computer, a laptop, a tablet computer, and peripheral device.

* * * * *